(12) United States Patent
Le et al.

(10) Patent No.: US 11,004,982 B2
(45) Date of Patent: May 11, 2021

(54) GATE FOR A TRANSISTOR

(71) Applicant: Intel Corporation, Santa Clara, CA (US)

(72) Inventors: Van H. Le, Portland, OR (US); Abhishek A. Sharma, Hillsboro, OR (US); Ravi Pillarisetty, Portland, OR (US); Gilbert W. Dewey, Beaverton, OR (US); Shriram Shivaraman, Hillsboro, OR (US); Tristan A. Tronic, Aloha, OR (US); Sanaz Gardner, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/495,600

(22) PCT Filed: Mar. 31, 2017

(86) PCT No.: PCT/US2017/025254
§ 371 (c)(1),
(2) Date: Sep. 19, 2019

(87) PCT Pub. No.: WO2018/182666
PCT Pub. Date: Oct. 4, 2018

(65) Prior Publication Data
US 2020/0027883 A1 Jan. 23, 2020

(51) Int. Cl.
*H01L 29/786* (2006.01)
*H01L 27/108* (2006.01)
*H01L 29/66* (2006.01)

(52) U.S. Cl.
CPC .. *H01L 29/78669* (2013.01); *H01L 27/10873* (2013.01); *H01L 29/6656* (2013.01)

(58) Field of Classification Search
None
See application file for complete search history.

(56) References Cited

U.S. PATENT DOCUMENTS 6,777,288 B1  8/2004  Padmanabhan et al.
6,881,616 B1  4/2005  Hellig et al.
(Continued)

FOREIGN PATENT DOCUMENTS

WO    2018182666 A1    10/2018

OTHER PUBLICATIONS

T. Onuki et al., "Embedded memory and ARM Cortex-M0 core using 60-nm C-axis aligned crystalline indium-gallium-zinc oxide FET integrated with 65-nm Si CMOS," 2016 IEEE Symposium on VLSI Circuits (VLSI-Circuits), Honolulu, HI, 2016, pp. 1-2, doi: 10.1109/VLSIC.2016.7573504. (Year: 2016).*

(Continued)

*Primary Examiner* — J. E. Schoenholtz
(74) *Attorney, Agent, or Firm* — Patent Capital Group

(57) ABSTRACT

Substrates, assemblies, and techniques for an apparatus, where the apparatus includes a gate, where the gate includes a first gate side and a second gate side opposite to the first gate side, a gate dielectric on the gate, where the gate dielectric includes a first gate dielectric side and a second gate dielectric side opposite to the first gate dielectric side, a first dielectric, where the first dielectric abuts the first gate side, the first gate dielectric side, the second gate side, and the second gate dielectric side, a channel, where the gate dielectric is between the channel and the gate, a source coupled with the channel, and a drain coupled with the channel, where the first dielectric abuts the source and the drain. In an example, the first dielectric and the gate dielectric help insulate the gate from the channel, the source, and the drain.

20 Claims, 11 Drawing Sheets

(56) References Cited

U.S. PATENT DOCUMENTS

| | | | |
|---|---|---|---|
| 8,339,828 B2* | 12/2012 | Yamazaki | H01L 29/78603 |
| | | | 365/72 |
| 10,304,523 B2* | 5/2019 | Kato | G11C 11/4096 |
| 2004/0171247 A1 | 9/2004 | Cho et al. | |
| 2012/0057396 A1* | 3/2012 | Yamazaki | G11C 5/025 |
| | | | 365/149 |
| 2012/0223303 A1 | 9/2012 | Ye | |
| 2014/0353754 A1* | 12/2014 | Farmer | H01L 29/778 |
| | | | 257/347 |
| 2015/0261965 A1* | 9/2015 | Brumley | G09C 1/00 |
| | | | 713/193 |
| 2015/0325282 A1* | 11/2015 | Kato | G11C 11/4097 |
| | | | 365/51 |
| 2015/0355700 A1* | 12/2015 | Pusukuri | G06F 1/324 |
| | | | 713/323 |

OTHER PUBLICATIONS

Burton et al., "FIVR—Fully integrated voltage regulators on 4th generation Intel® Core™ SoCs," 2014 IEEE Applied Power Electronics Conference and Exposition—APEC 2014, Fort Worth, TX, 2014, pp. 432-439, doi: 10.1109/APEC.2014.6803344. (Year: 2014).*
Das, M., Power Performance of IGZO DRAM Memory, University of Virginia School of Engineering and Applied Science, thesis May 2019. (Year: 2019).*
PCT Dec. 27, 2017 International Search Report and Written Opinion from PCT/US2017/025254; 13 pages.

\* cited by examiner

GATE FOR A TRANSISTOR

CROSS-REFERENCE TO RELATED APPLICATION

This application is a national stage application under 35 U.S.C. § 371 of PCT International Application Serial No. PCT/US2017/025254, filed Mar. 31, 2017 and entitled "GATE FOR A TRANSISTOR," which is hereby incorporated by reference herein in its entirety.

TECHNICAL FIELD

The present disclosure relates generally to the field of transistors, and more particularly, to a gate for a transistor.

BACKGROUND

Most, if not all, logic devices require some type of memory cell such as random access memory (RAM). Dynamic random-access memory (DRAM) is a type of random-access memory that stores each bit of data in a separate capacitor. The capacitor can be charged or discharged and these two states are taken to represent the two values of a bit, (i.e., 1 and 0). DRAM is widely used in digital electronics where low-cost and high-capacity memory is required. One of the largest applications for DRAM is the main memory, or RAM, in modern computers and electronics. The DRAM is typically coupled to a transistor. However, transistors leak a small amount current and can cause the capacitor of the DRMA to discharge and fade.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

Figure 1:
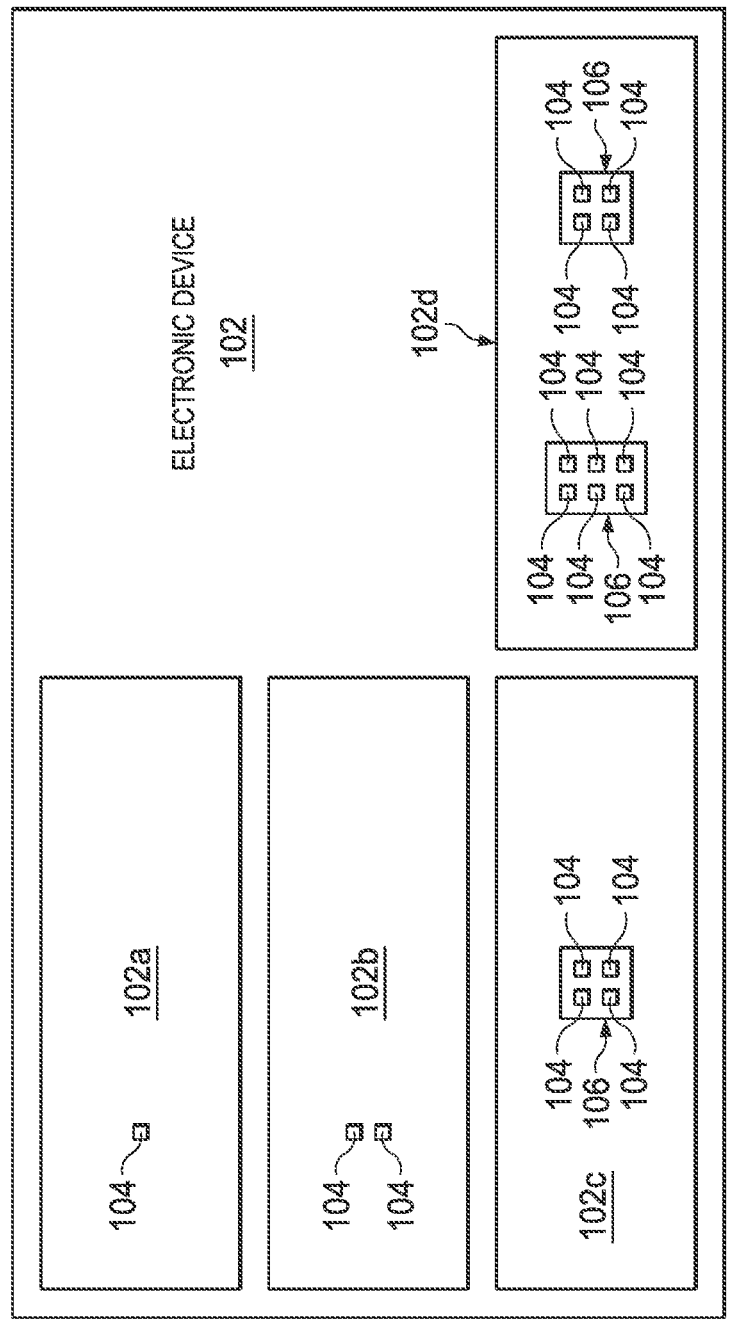
FIG. 1 is a simplified block diagram illustrating an embodiment of a portion of an electronic device, in accordance with one embodiment of the present disclosure.

The figures of the drawings are not necessarily drawn to scale, as their dimensions can be varied considerably without departing from the scope of the present disclosure.

DETAILED DESCRIPTION

The following detailed description sets forth example embodiments of apparatuses, methods, and systems relating to a gate for a transistor. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Disclosed herein are substrates, assemblies, and techniques for enabling a device that includes one or more transistors. The transistors can include configured to allow for relatively low leakage when the gate is biased to off conditions and only conduct one type of charge (i.e., electrons). In a specific example, a transistor can include a gate, a dielectric above the gate, a channel above the dielectric, a source, and a drain where a channel couples the source and the drain. A first dielectric (e.g., a nitride) can be located along the sides of the gate and under the source and the drain. The first dielectric and the dielectric can help insulate the gate from the channel, the source, and the drain and allow the transistor to exhibit a relatively low amount of leakage. For example, a larger bandgap from an oxide layer in the transistor enables less leakage. The bottom gate of the transistor can be created using a self-aligning process. The self-aligning process allows for a reduction in gate length variability during manufacturing of the transistor. This can allow for reliable control of subthreshold leakage and good electrostatics along with short channel effects to help enhance performance at scaled dimensions.

The terms "over," "under," "below," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, iridium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. The figures illustrate straight lines and parallel features however, one skilled in the art will recognize that the scope of the present disclosure does not require straight lines and parallel features and deviation is allowed. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

FIG. 1 is a simplified block diagram of an electronic device 100 that includes one or more transistors and arrays in accordance with an embodiment of the present disclosure. Electronic device 100 can be any electronic device that includes memory (e.g., computer, smartphone, laptop, desktop, Internet-of-Things (IoT) device, vehicle electronics, handheld electronic device, personal digital assistant, wearable, household electronics, etc.). Electronic device 100 can include one or more electronic elements 102a-102d. Each electronic element 102a-102d can include one or more transistors 104 and/or one or more transistor arrays 106. Each transistor array 106 can be a systematic arrangement of a plurality of transistors 104, (e.g., in rows and columns).

Transistor 104 can be configured to provide for relatively low leakage and to include a bottom gate that was created using a self-aligning process. The self-aligning process allows for a reduction in gate length variability during manufacturing of the transistor. This can allow for reliable control of subthreshold leakage and good electrostatics along with short channel effects to help enhance performance at scaled dimensions. The reliable control of subthreshold leakage allows for transistor 104 to have low leakage compared to some current transistors. The use of the bottom gate can create a fin-like gate and enable a back end of line (BEOL) self-aligned gate device for oxide semiconductor channels.

Transistor 104 can be a transistor or an electronic switch that can be either in an "on" or "off" state and the term "transistor" includes a metal-oxide-semiconductor (MOS), complementary MOS (CMOS), n-channel MOS (NMOS) p-channel MOS (PMOS), MOS field-effect transistors (MOSFET), bipolar junction transistor (BJT), filed effect transistor (FET), finFET, junction gate FET (JFET), insulated gate FET (IGFET), n-channel field effect transistor (NFET) insulated-gate bipolar transistor, or other similar transistor that can be configured to perform the functions, features, and operations disclosed herein. In an example, transistor 104 can be a backend transistor. A backend transistor is a thin filmed transistor above a metal one layer. Backend transistors can allow device functionally to be scaled by stacking memory and logic in the backend. However, some backend transistors suffer from high contact resistance and a relatively large amount of leakage. This may render some backend transistors useless due to low drive current and thus degrade the performance of the memory or logic system.

Transistor 104 can be coupled to a capacitive element. The capacitive element may be a memory element such as embedded dynamic random access memory (eDRAM). In another example, transistor 104 can be coupled to a resistive element such as resistive random-access memory (RRAM). In yet another example, transistor 104 can be coupled to some other type of memory or element. eDRAM can be integrated on the same die or multi-chip module (MCM) of an application-specific integrated circuit (ASIC) or microprocessor. Embedding memory on the ASIC or microprocessor allows for relatively wider buses and high operation speeds. Also, due to the much higher density of DRAM in comparison to SRAM, larger amounts of memory can be installed on smaller chips.

One issue with traditional transistors is that during the manufacturing process, the channel length can vary from transistor to transistor. This variability can make it difficult to reliably control the subthreshold leakage current in the transistor and can also result in transistors falling outside of specification requirements. The term "leak" or "leakage" refers to the small amount of current all transistors conduct, even when they are turned off. If the transistor is coupled to a capacitive element, the leakage causes a gradual loss of energy from a capacitive element as the current slowly discharges from the capacitive element. Leakage is currently one of the main factors limiting increased computer processor performance. Transistor 104 can be configured to resolve these issues (and others). For example, due to the inherent properties of the material in transistor 104, transistor 104 can be configured to allow for relatively low leakage. For example, a larger bandgap from an oxide layer in transistor 104 enables less leakage. In traditional silicon transistors, there are majority and minority carriers (i.e. both holes and electrons) which means the traditional silicon transistor can have leakage in either directions of the gate bias. Transistor 104 can be configured with the ability to only conduct one type of charge (i.e., electrons) and allow for relatively low leakage current as the gate is biased to off conditions. In a specific example, transistor 104 can include a gate, a gate dielectric above the gate, a channel above the dielectric, a source, and a drain where a channel couples the source and the drain. A first dielectric can be located along the sides of the gate and under the source and the drain. The first dielectric and the gate dielectric can help insulate the gate from the channel, the source, and the drain and allow transistor 104 to exhibit a relatively low amount of leakage.

Figure 2:
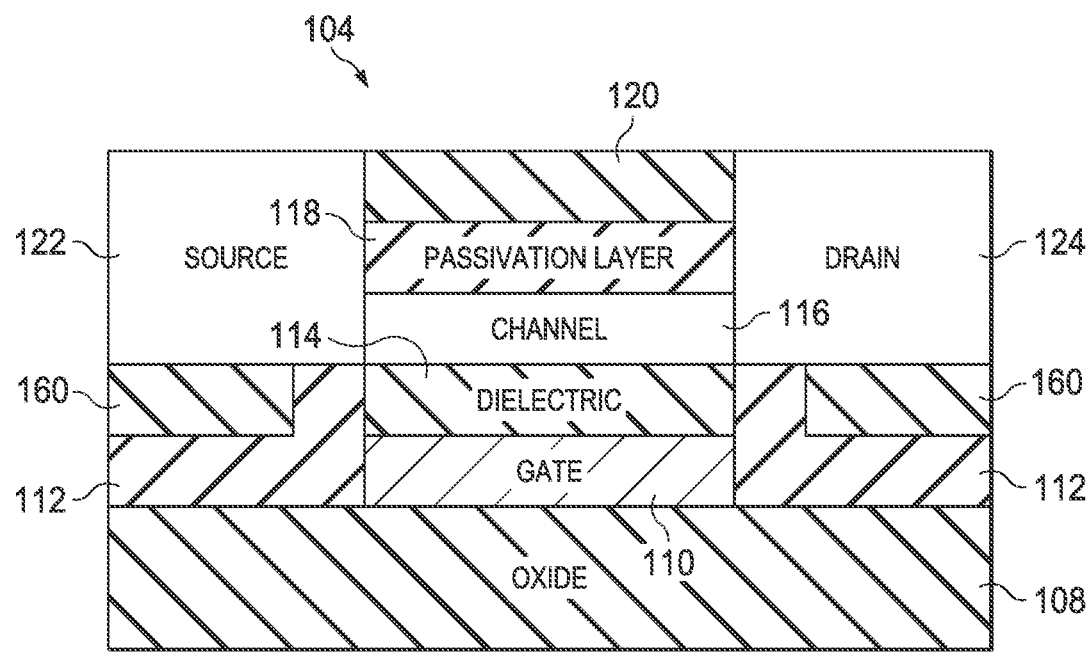
FIG. 2 is a simplified block diagram illustrating an embodiment of a portion of an electronic device, in accordance with one embodiment of the present disclosure.

Turning to FIG. 2, FIG. 2 illustrates one embodiment of transistor 104. Transistor 104 can include an oxide 108, a gate 110, a first dielectric 112, a second dielectric 160, a gate dielectric 114, a channel 116, a passivation layer 118, a third dielectric 120, a source 122, and a drain 124. Source 122 and drain 124 can be coupled to each other using channel 116. In an example, second dielectric 160 is the same material as oxide 108. First dielectric 112 can help insulate gate 110 and gate dielectric 114 from oxide 108 and second dielectric 160 and can help ensure there is relatively low leakage in transistor 104. Gate 110 can be configured as a gate or word line. Source 122 can be configured as a source. Drain 124 can be configured as a drain or bit line. First dielectric 112 can abut the sides of gate 110 (e.g., a first gate side of gate 110 and a second gate side of gate 110) and the sides of gate dielectric 114 (e.g., a first gate dielectric side of gate dielectric 114 and a second gate dielectric side of gate dielectric 114) to help prevent gate 110 shorts.

In the case of an NMOS transistor, when a positive voltage that is greater than the threshold voltage of the NMOS transistor is applied, channel 118 will allow current to flow from source 122 to drain 124. In the case of a PMOS transistor, when a negative voltage that is greater than the threshold voltage of the PMOS transistor is applied, then channel 116 will allow the current to flow. In both the NMOS transistor and the PMOS transistor, when the voltage is below the threshold voltage, the transistor will shut off and the current does not flow. The larger bandgap in transistor 104 and the ability to only conduct one type of charge helps ensure there is relatively low leakage in transistor 104.

Oxide 108 can be a non-semiconducting substrate and may be composed of silicon dioxide, inter-layer dielectric composed of silicon dioxide, titanium oxide, other transition metal oxides, or other material with a large bandgap that may serve as a non-conductive layer. Gate 110 can be composed of different metals with various work functions from ranges of about 5.6 eV to about 3.8 eV. More specifically, gate 110 can be composed of layers or bi-layers of tungsten, cobalt, titanium nitride, tantalum nitride, titanium, aluminum, indium tin oxide, tantalum, ruthenium, hafnium, and other similar materials. First dielectric 112 may be composed of silicon nitride, silicon dioxide, silicon oxynitride, carbon doped silicon dioxide, carbon doped silicon nitride, or some other material that can insulate gate 110 and gate dielectric 114 from oxide 108 and second dielectric 160 and help reduce leakage in transistor 104. Second dielectric 160 can be a non-semiconducting substrate and may be composed of silicon dioxide, inter-layer dielectric composed of silicon dioxide, silicon nitride, silicon oxynitrides, titanium oxide, other transition metal oxides, or other material with a large bandgap that may serve as a non-conductive layer. In an example, second dielectric 160 is the same material as oxide 108. In other example, second dielectric 160 can be the same material as the material of an adjacent layer on a chip or die. Gate dielectric 114 can be a dielectric and may be a high-k dielectric material and comprised of one or more layers of silicon oxide, silicon dioxide, ternary metal oxides, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. More specifically, the high-k dielectric materials can include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on gate dielectric 114 to improve its quality when a high-k material is used.

Channel 116 can be composed of indium gallium zinc oxide, zinc oxide, zinc oxynitrides, gallium oxide, tin oxide, copper oxide, indium zinc oxide, indium oxide, or some other semiconducting metal oxide, or other semiconducting material. Passivation layer 118 can be comprised of a low K dielectric, silicon dioxide doped with carbon, titanium oxide, hafnium oxide, or some other material that acts as a passivation layer. Third dielectric 120 can be composed of a material with different etch properties than the material in first dielectric 112 and second dielectric 160 and can include silicon nitride, silicon dioxide, silicon oxynitride, carbon doped silicon dioxide, carbon doped silicon nitride or some other material other than the material in first dielectric 112 and second dielectric 160. Source 122 can be composed of different metals with various work functions from ranges of about 5.6 eV to about 3.8 eV. More specifically, source 122 can be composed of layers or bi-layers of tungsten, cobalt, titanium nitride, tantalum nitride, titanium, aluminum, indium tin oxide, tantalum, ruthenium, hafnium, and other similar materials. Drain 124 can be comprised of different metals with various work functions from ranges of about 5.6 eV to about 3.8 eV. More specifically, drain 124 can be composed of layers or bi-layers of tungsten, cobalt, titanium nitride, tantalum nitride, titanium, aluminum, indium tin oxide, tantalum, ruthenium, hafnium, and other similar materials.

Figure 3:
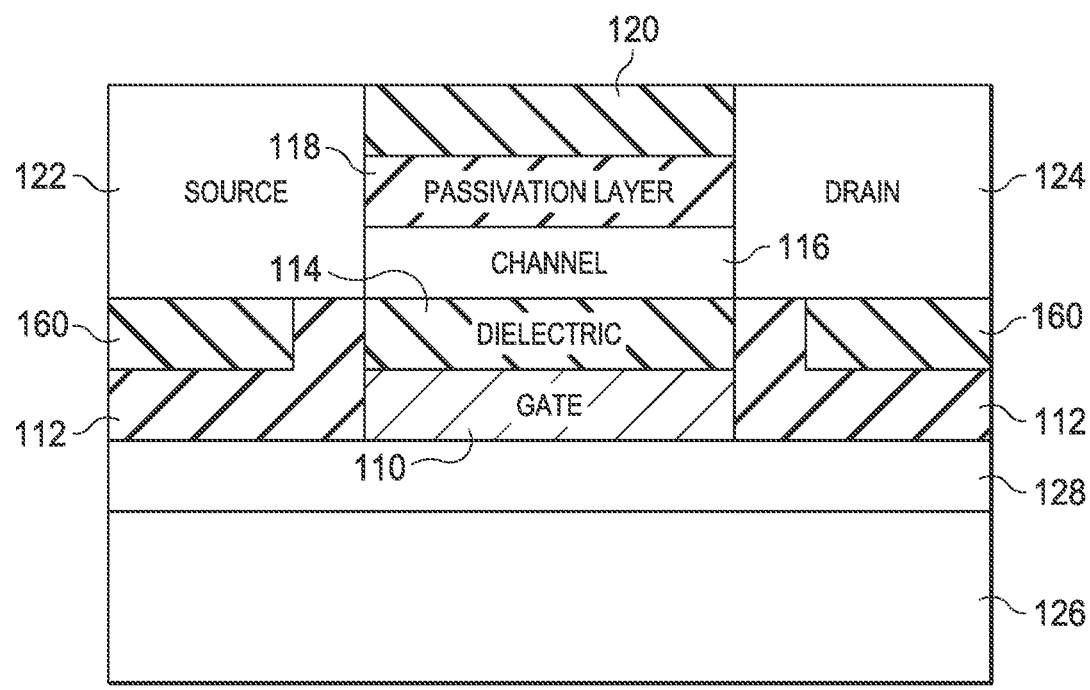
FIG. 3 is a simplified block diagram illustrating an embodiment of a portion of an electronic device, in accordance with one embodiment of the present disclosure.

Turning to FIG. 3, FIG. 3 illustrate one embodiment of transistor 104. Transistor 104 can be over one or more interlayer dielectrics (ILD) 126. ILD 126 layers may be formed using dielectric materials known for their applicability in integrated circuit structures, such as low-k dielectric materials. Examples of dielectric materials that may be used in ILD 126 include, but are not limited to, silicon dioxide, carbon doped oxide, silicon nitride, organic polymers such as perfluorocyclobutane or polytetrafluoroethylene, fluorosilicate glass, and organosilicates such as silsesquioxane, siloxane, or organosilicate glass. ILD 126 may include pores or air gaps to further reduce their dielectric constant. Nitride 128 can be from previous metal layers and can be on ILD 126 and under gate 110 and first dielectric 112.

Figure 4:
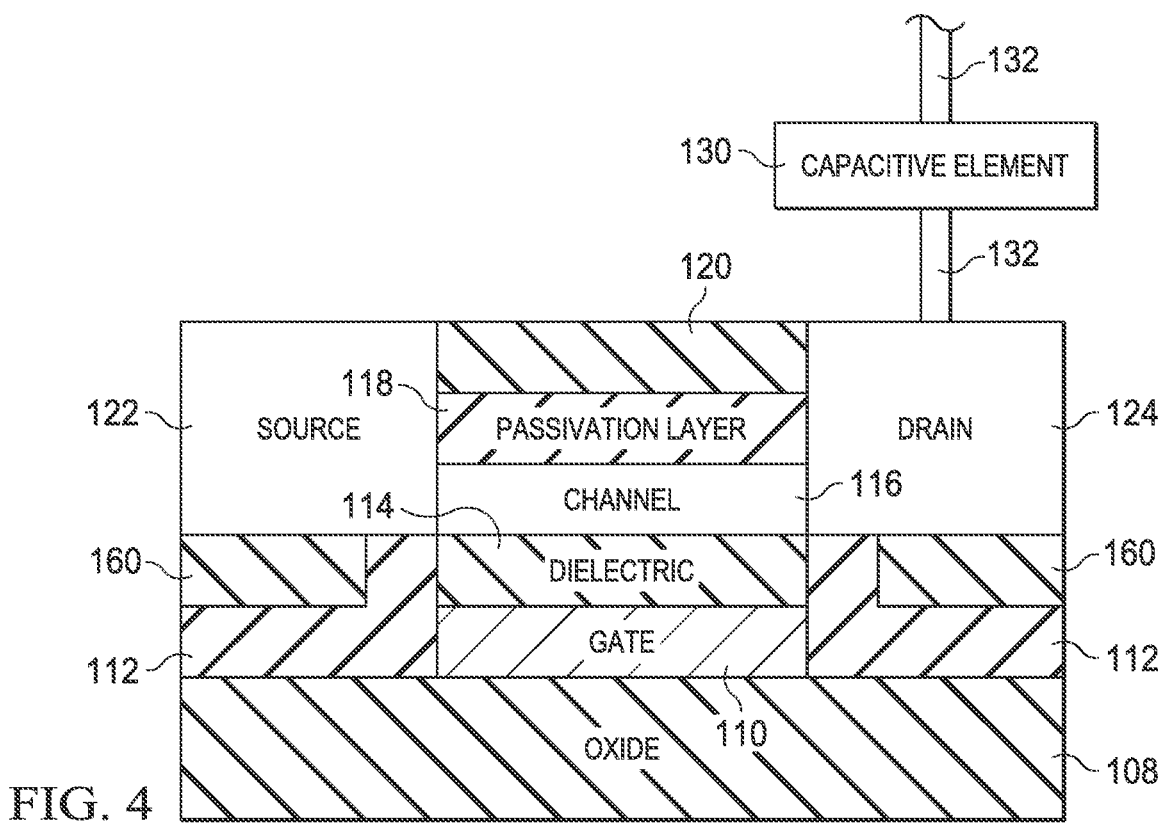
FIG. 4 is a simplified block diagram illustrating an embodiment of a portion of an electronic device, in accordance with one embodiment of the present disclosure.
Figure 6:
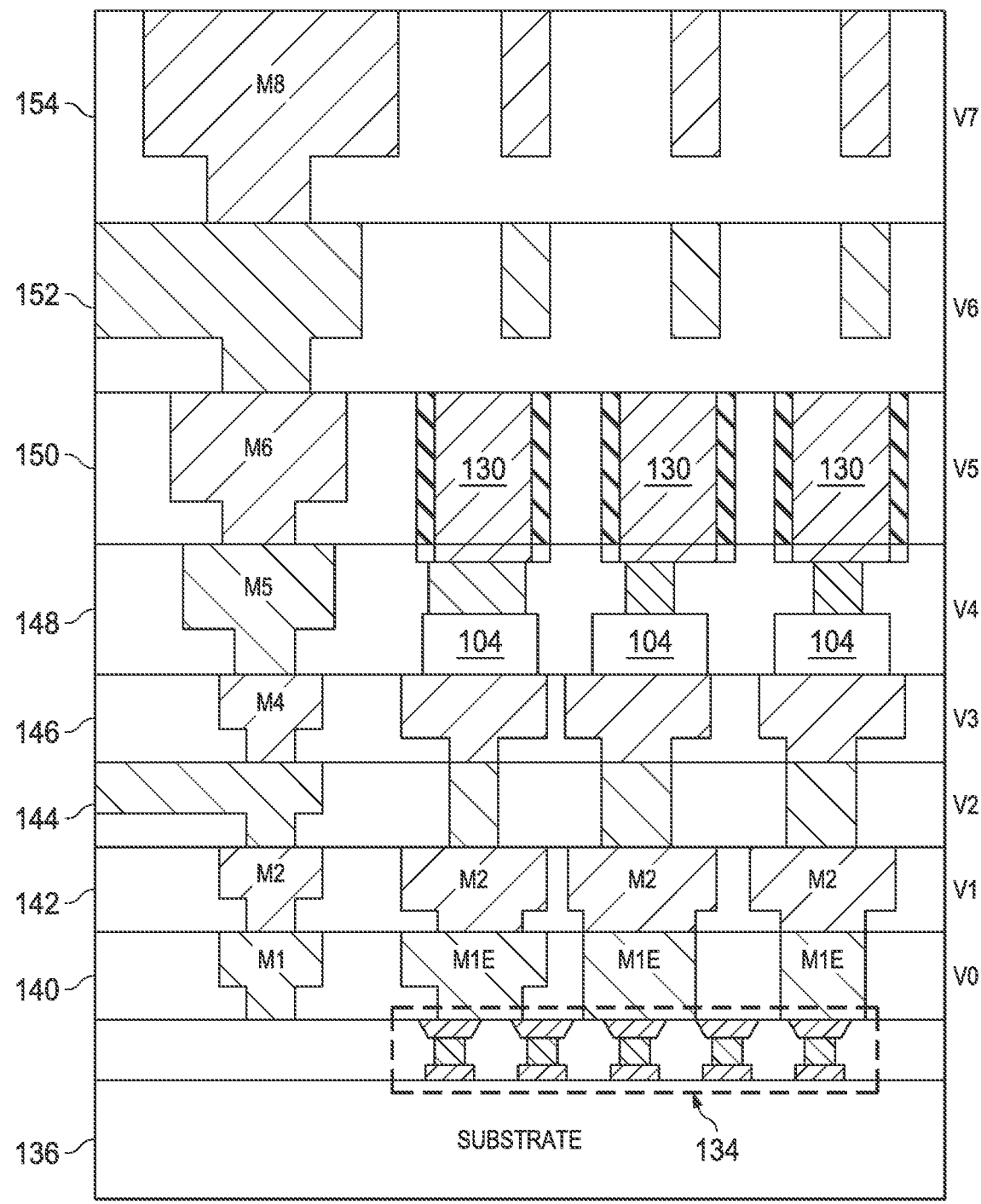
FIG. 6 is a simplified block diagram illustrating an embodiment of a portion of an electronic device, in accordance with one embodiment of the present disclosure.

Turning to FIG. 4, FIG. 4 illustrates one embodiment of transistor 104. In a specific implementation, transistor 104 can be coupled to a capacitive element 130 using connector 132. Capacitive element 130 may be a memory element such as RAM, eDRAM. In other examples, capacitive element 130 may not be a capacitive element but a phase change material or resistive element such as a resistive memory element (e.g., RRAM). In yet another example, capacitive element 130 may be magnetoresistive RAM (MRAM), phase change memory, or some other type of memory element. Connector 132 can be configured as metal connections for transistor 104 and may be a metal connection from capacitive element 130 to drain 124. Connector 132 can be part of a metal-2 or metal-3 extended connection, part of a metal-4 or metal-5 extended connection (as illustrated in FIG. 6), or part of some other metal layer or extended connection.

Transistor 104 can be configured to allow access to capacitive element 130 and charge or change the resistance of capacitive element 130. For example, transistor 104 can be configured to program capacitive element 130, charge or discharge capacitive element 130, deselect or not disturb capacitive element 130, read capacitive element 130, etc. In one implementation, capacitive element 130 can acquire a charge by applying a bias and running a current through transistor 104 and capacitive element 130. When transistor 104 is turned off, the channel resistance is increased significantly and leakage from capacitive element 130 may be reduced as compared to traditional transistors due to the inherent material properties of transistor 104.

In a specific example, transistor 104 may be a low off-state leakage write transistor, such as amorphous oxide semiconductors. Capacitive element 130 may be a small charge storage metal-insulator-metal (MIM) capacitor. The ability to use the smaller MIM capacitor is due to the lower leakage offered by transistor 104. As a result, different integration schemes that create metal oxide thin film transistors with scaled dimensions can be used in realizing a monolithic, BEOL, embedded one transistor-one capacitor (1T-1C) DRAM that allows for density improvements over current transistors.

Figure 5:
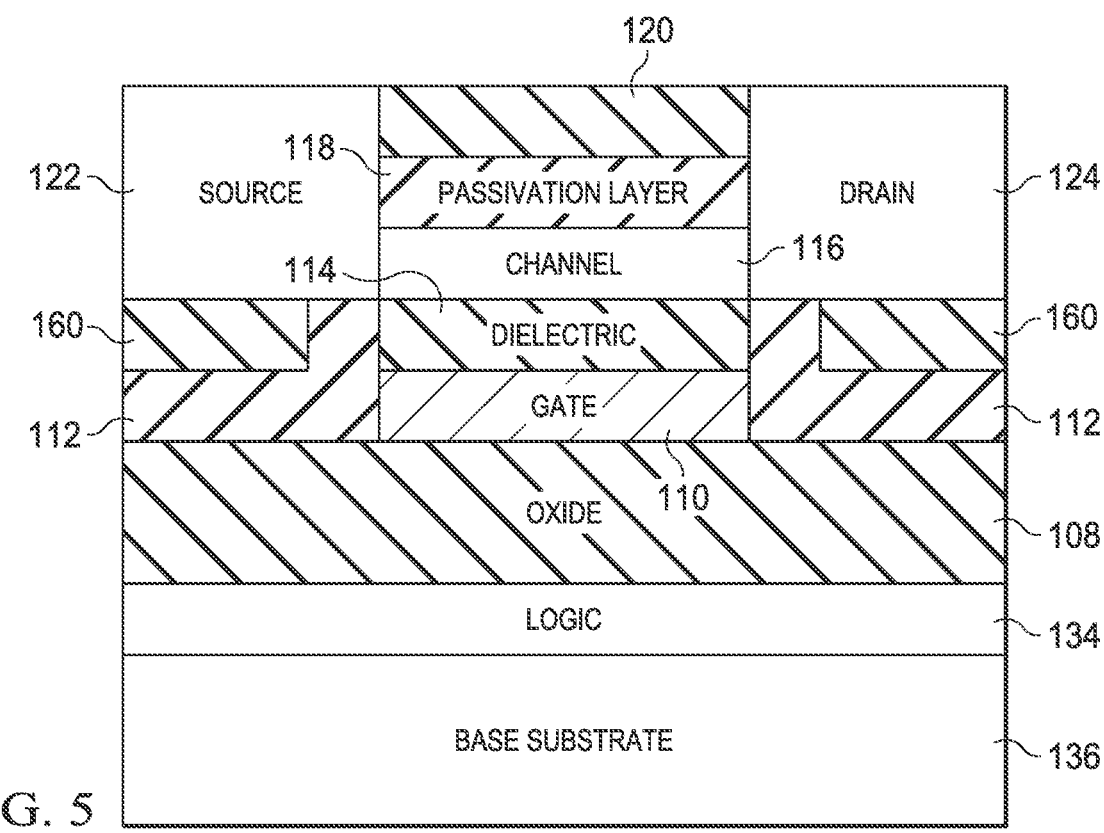
FIG. 5 is a simplified block diagram illustrating an embodiment of a portion of an electronic device, in accordance with one embodiment of the present disclosure.

Turning to FIG. 5, FIG. 5 illustrate one embodiment of transistor 104. Transistor 104 can be over a silicon based element such as logic circuitry. For example, transistor 104 can be over logic element 134. Logic element 134 can be on or over a base substrate 136. Base substrate 136 may be a silicon based substrate. Logic element 134 can include transistors, logic (e.g., adders, registers, etc.), micro-processor circuits for processing data and other circuitry. In an example, logic element 134 can communicate with capacitive element 130 through transistor 104 and cause data (or a charge) to be stored in one or more capacitive elements 130.

Scaling of logic devices is typically accomplished by reducing the size of the logic device. One approach is based on increasing the number of logic elements per unit area. To increase the number of logic elements per unit area, the density of dies needs to be increased and additional logic devices need to be fabricated above the silicon. To increase the density of dies in an integrated circuit (IC) package of a particular footprint, one or more transistors 104 may be stacked on top of each other such that instead of fabricating transistor 104 on base substrate 136, transistor 104 can be fabricated above base substrate 136.

Turning to FIG. 6, FIG. 6 illustrates an example of an IC package that includes one embodiment of transistor 104. The IC package can be on base substrate 136 and can include one or more logic elements 134, a first metal layer 140, a second metal layer 142, a third metal layer 144, a fourth metal layer 146, a fifth metal layer 148, a sixth metal layer 150, a seventh metal layer 152, and an eight metal layer 154. As illustrated in FIG. 5, transistor 104 can be in or on fifth metal layer 148 and capacitive element 130 can be in or on sixth metal layer 150. It should be noted that more or less metal layers than illustrated in FIG. 5 may be present. Also, one or more transistors 104 may be in or on one or more different metal layers than the illustrated fifth metal layer 148 and in or one or more capacitive elements 130 may be on one or more different metal layers than the illustrated sixth metal layer 150.

If base substrate 136 is a semiconductor substrate, the semiconductor substrate (and any additional silicon based layers) may be formed using alternate materials, which may or may not be combined with silicon. This includes, but is not limited to, silicon, silicon germanium, germanium, indium antimonide, lead telluride, indium arsenide, indium phosphide, gallium arsenide, indium gallium arsenide, gallium antimonide, or other combinations of group III-V or group IV materials. In other examples, the substrate of any layer may be a flexible substrate including 2D materials such as graphene and molybdenum disulfide, organic materials such as pentacene, transparent oxides such as indium gallium zinc oxide poly/amorphous (low temperature of dep) III-V semiconductors and germanium/silicon, and other non-silicon flexible substrates.

In an example, a plurality of electrical components can include one or more transistors 104 and/or one or more arrays 106 of transistors 104. In addition, a plurality of transistors, such as MOSFET or simply MOS transistors, can include one or more transistors 104 and may be fabricated on base substrate 136. In various embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate planar transistors, it should be noted that various embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers generally include deposition and etching process steps. In an alternate implementation, a plurality of spacer pairs may be used, for instance, two pairs, three pairs, or four pairs of sidewall spacers may be formed on opposing sides of the gate stack.

Source and drain regions can be formed within base substrate 136 adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations, the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more may be deposited over the MOS transistors. The ILD layers may be formed using dielectric materials known for their applicability in integrated circuit structures, such as low-k dielectric materials. Examples of dielectric materials that may be used include, but are not limited to, silicon dioxide, carbon doped oxide, silicon nitride, organic polymers such as perfluorocyclobutane or polytetrafluoroethylene, fluorosilicate glass, and organosilicates such as silsesquioxane, siloxane, or organosilicate glass. The ILD layers may include pores or air gaps to further reduce their dielectric constant.

Figure 7A:
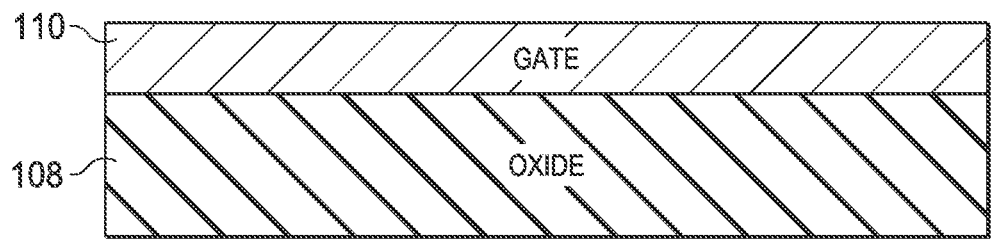
FIG. 7A is a simplified block diagram illustrating an embodiment of a portion of an electronic device, in accordance with one embodiment of the present disclosure.

Turning to FIG. 7A, FIG. 7A illustrates a simplified block diagram of an early stage in the formation of transistor 104 in accordance with an embodiment of the present disclosure. As illustrated in FIG. 7A, gate 110 can be deposited on oxide 108. Gate 110 may be deposited using a spin-on deposition from slurry, sputtering, chemical vapor deposition (CVD), thermal vacuum deposition (TVD), atomic layer deposition (ALD), or any combination, or some other form of deposition that can deposit gate 110 on oxide 108. Oxide 108 may be about one (1) nanometers to about forty (40) nanometers in thickness. Gate 110 may also be about 1 nanometers to about 40 nanometers it thickness. Gate 110 can be can be etched, polished, planarized, and/or patterned.

Figure 7B:
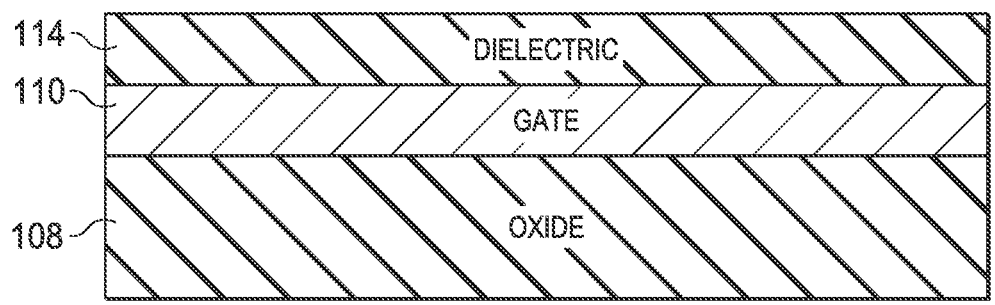
FIG. 7B is a simplified block diagram illustrating an embodiment of a portion of an electronic device, in accordance with one embodiment of the present disclosure.

Turning to FIG. 7B, FIG. 7B illustrates a simplified block diagram of an early stage in the formation of transistor 104 in accordance with an embodiment of the present disclosure. In an example, gate dielectric 114 can be deposited on gate 110. Gate dielectric 114 may be deposited using a spin-on deposition from slurry, sputtering, CVD, TVD, ALD, or any combination, or some other form of deposition that can deposit gate dielectric 114 on gate 110. Gate dielectric 114 may be about 1 nanometer to about twenty (20) nanometers in thickness. Gate dielectric 114 can be can be etched, polished, planarized, and/or patterned.

Figure 7C:
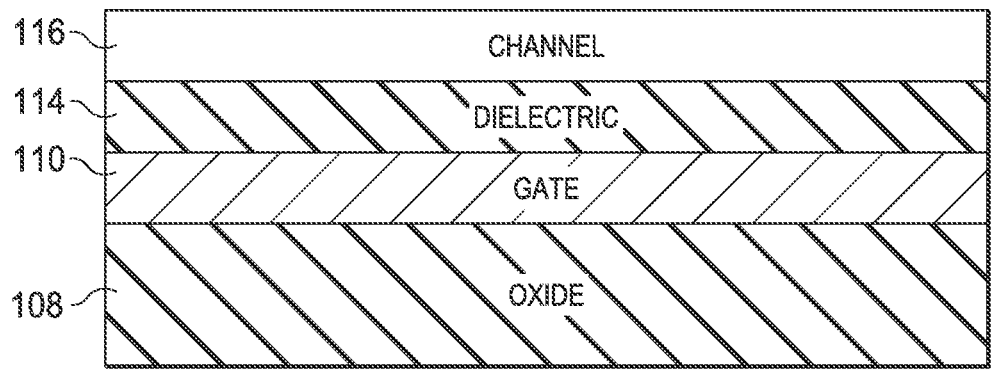
FIG. 7C is a simplified block diagram illustrating an embodiment of a portion of an electronic device, in accordance with one embodiment of the present disclosure.

Turning to FIG. 7C, FIG. 7C illustrates a simplified block diagram of an early stage in the formation of transistor 104 in accordance with an embodiment of the present disclosure.

Figure 7D:
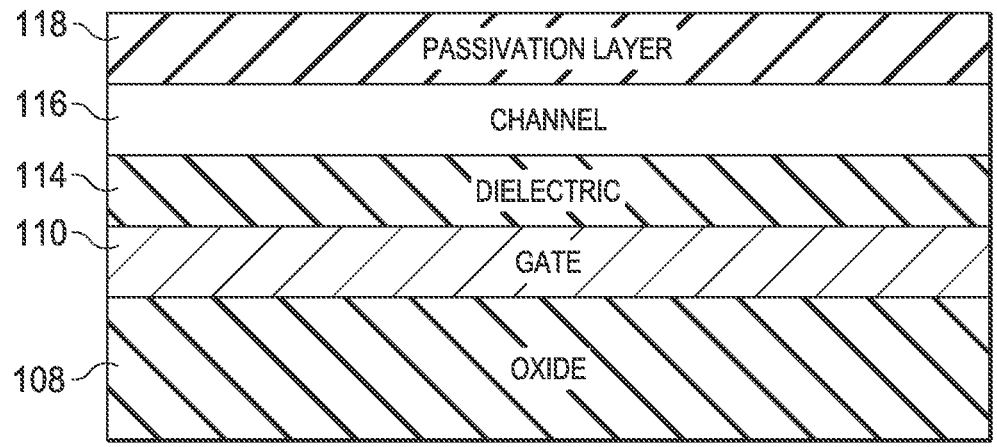
FIG. 7D is a simplified block diagram illustrating an embodiment of a portion of an electronic device, in accordance with one embodiment of the present disclosure.

In an example, channel 116 can be deposited on gate dielectric 114. Channel 116 may be deposited using a spin-on deposition from slurry, sputtering, CVD, TVD, ALD, or any combination, or some other form of deposition that can deposit channel 116 on gate dielectric 114. Channel 116 may be about three (3) nanometers to about 40 nanometers in thickness. Channel 116 can be e can be etched, polished, planarized, and/or patterned Turning to FIG. 7D, FIG. 7D illustrates a simplified block diagram of an early stage in the formation of transistor 104 in accordance with an embodiment of the present disclosure. In an example, passivation layer 118 can be deposited on channel 116. Passivation layer 118 may be deposited using a spin-on deposition from slurry, sputtering, CVD, TVD, ALD, or any combination, or some other form of deposition that can deposit passivation layer 118 on channel 116. Passivation layer 118 may be about 1 nanometer to about 40 nanometers in thickness. Passivation layer 118 can be can be can be etched, polished, planarized, and/or patterned.

Figure 7E:
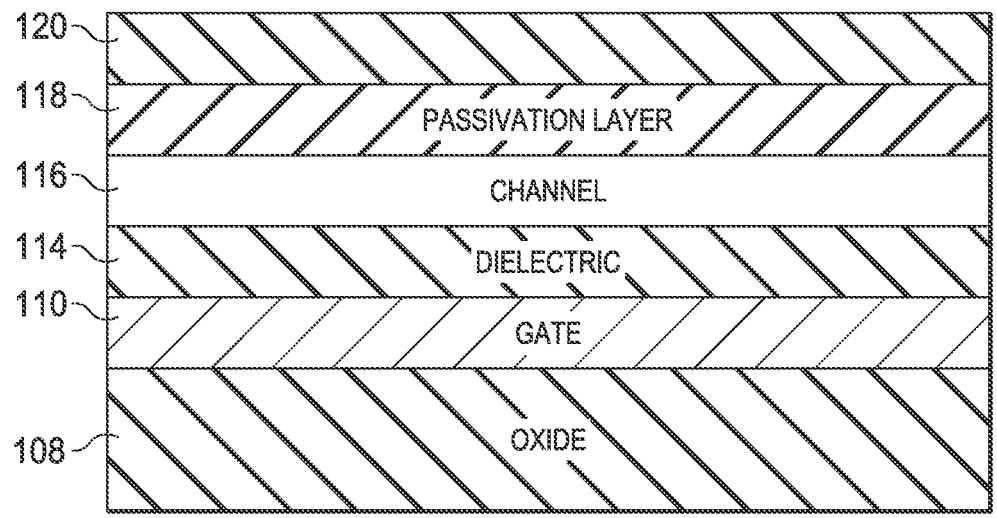
FIG. 7E is a simplified block diagram illustrating an embodiment of a portion of an electronic device, in accordance with one embodiment of the present disclosure.

Turning to FIG. 7E, FIG. 7E illustrates a simplified block diagram of a stage in the formation of transistor 104 in accordance with an embodiment of the present disclosure. In an example, third dielectric 120 can be deposited on passivation layer 118. Third dielectric 120 may be deposited using a spin-on deposition from slurry, sputtering, CVD, TVD, ALD, or any combination, or some other form of deposition that can deposit third dielectric 120 on passivation layer 118. Third dielectric 120 may be about 1 nanometer to about 40 nanometers in thickness. Third dielectric 120 can be can be can be etched, polished, planarized, and/or patterned.

Figure 7F:
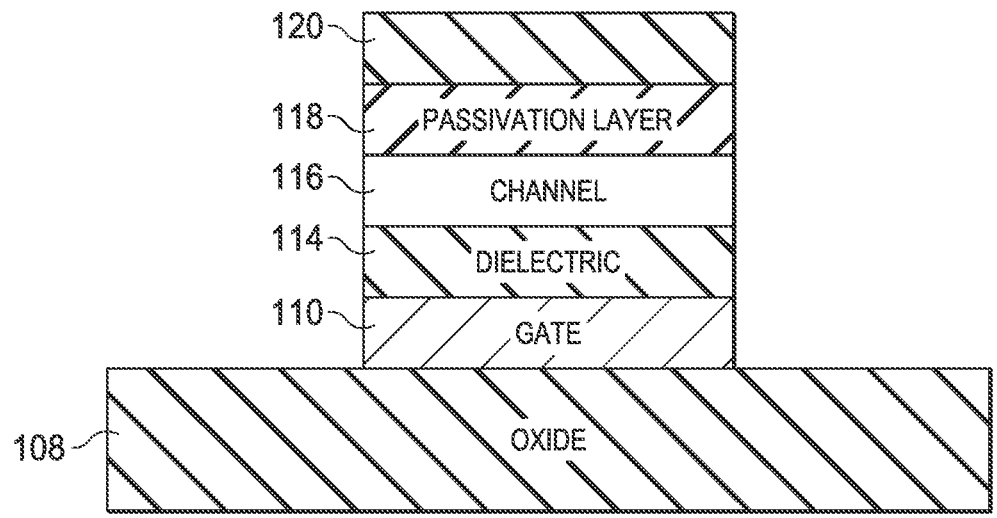
FIG. 7F is a simplified block diagram illustrating an embodiment of a portion of an electronic device, in accordance with one embodiment of the present disclosure.

Turning to FIG. 7F, FIG. 7F illustrates a simplified block diagram of a stage in the formation of transistor 104 in accordance with an embodiment of the present disclosure. As illustrated in FIG. 7F, gate 110, gate dielectric 114, channel 116, passivation layer 188, and third dielectric 120 can be etched. The etching can extend down to oxide 108.

Figure 7G:
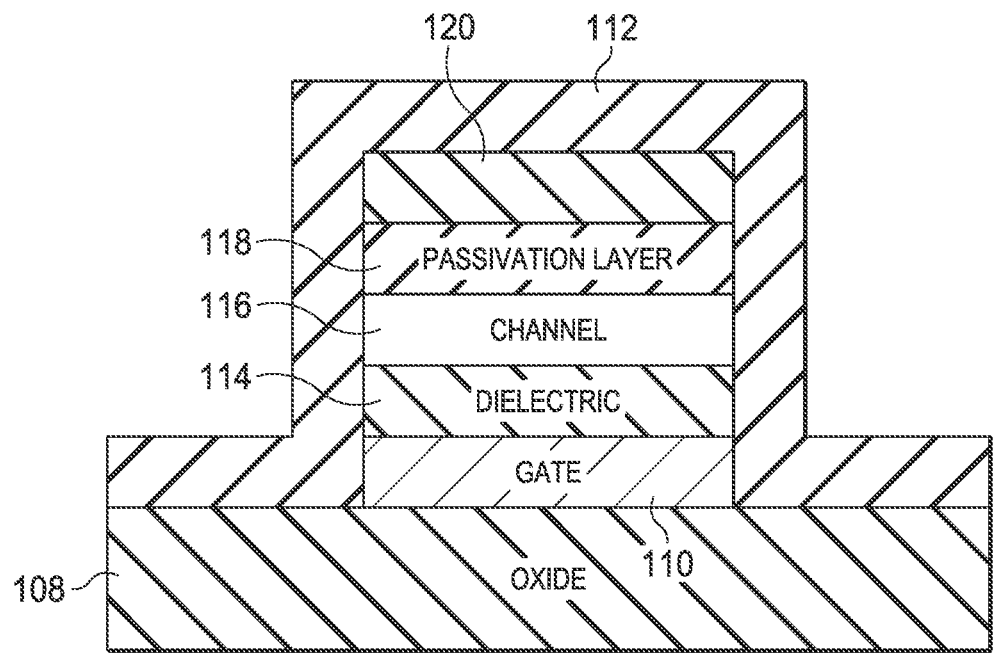
FIG. 7G is a simplified block diagram illustrating an embodiment of a portion of an electronic device, in accordance with one embodiment of the present disclosure.

Turning to FIG. 7G, FIG. 7G illustrates a simplified block diagram of a stage in the formation of transistor 104 in accordance with an embodiment of the present disclosure. In an example, first dielectric 112 can be deposited over oxide 108, gate 110, gate dielectric 114, channel 116, passivation layer 188, and third dielectric 120. First dielectric 112 may be deposited using a spin-on deposition from slurry, sputtering, CVD, TVD, ALD, or any combination, or some other form of deposition that can deposit first dielectric 112 over oxide 108, gate 110, gate dielectric 114, channel 116, passivation layer 188, and third dielectric 120. First dielectric 112 may be about 1 nanometer to about 40 nanometers in thickness. First dielectric 112 can be can be can be etched, polished, planarized, and/or patterned.

Figure 7H:
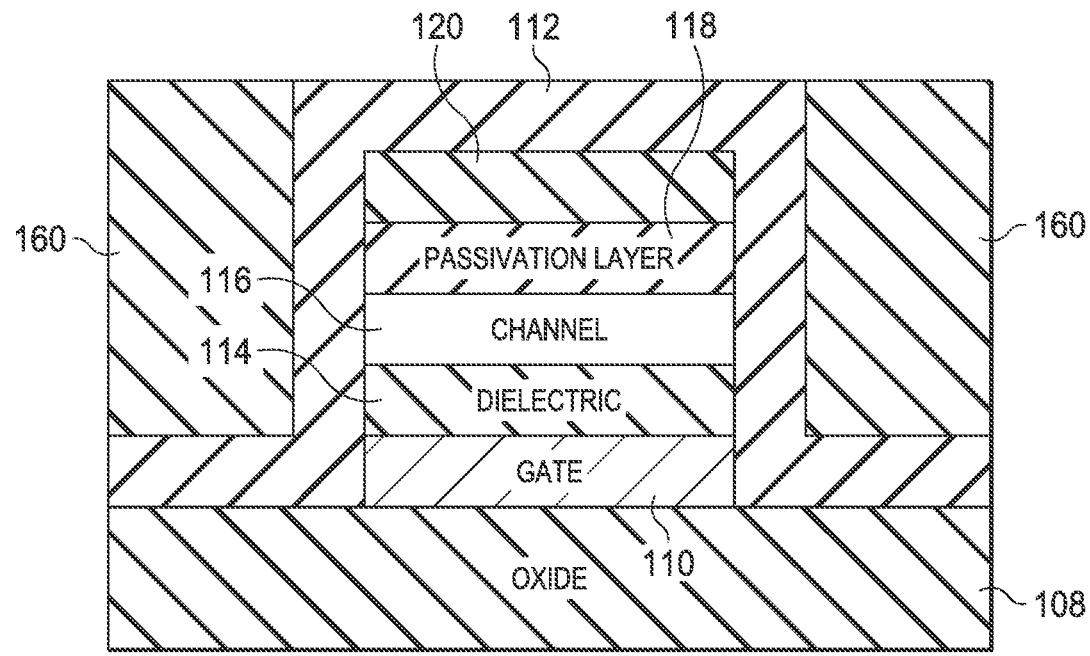
FIG. 7H is a simplified block diagram illustrating an embodiment of a portion of an electronic device, in accordance with one embodiment of the present disclosure.

Turning to FIG. 7H, FIG. 7H illustrates a simplified block diagram of a stage in the formation of transistor 104 in accordance with an embodiment of the present disclosure. In an example, second dielectric 160 can be deposited over first dielectric 112. Second dielectric 160 may be deposited using a spin-on deposition from slurry, sputtering, CVD, TVD, ALD, or any combination, or some other form of deposition that can deposit second dielectric 160 over first dielectric 112. Second dielectric 160 may be about 1 nanometer to about 40 nanometers in thickness. Second dielectric 160 can be can be can be etched, polished, planarized, and/or patterned.

Figure 7I:
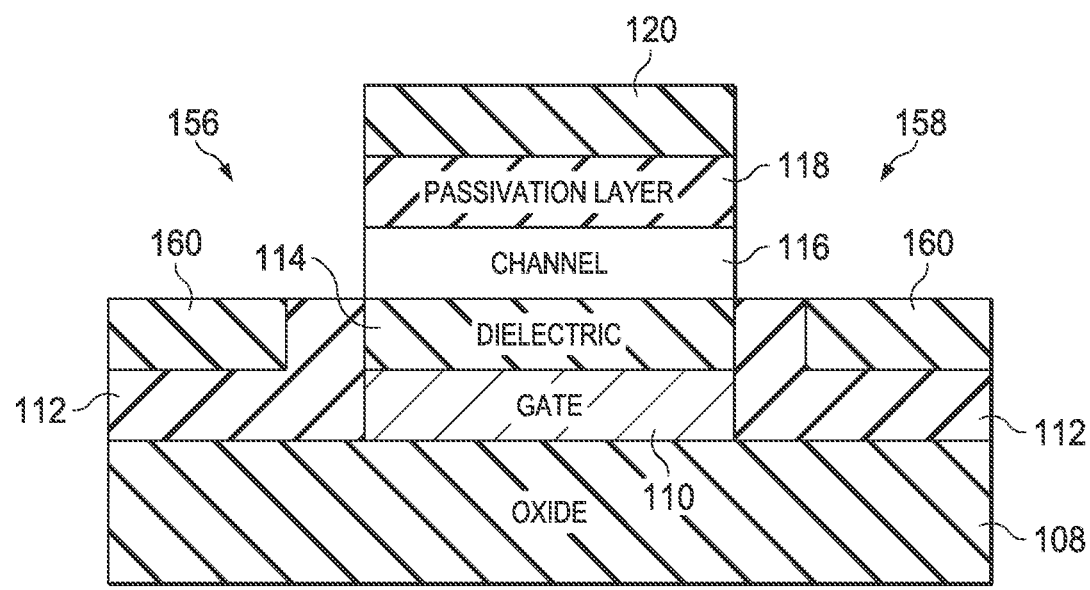
FIG. 7I is a simplified block diagram illustrating an embodiment of a portion of an electronic device, in accordance with one embodiment of the present disclosure.

Turning to FIG. 7I, FIG. 7I illustrates a simplified block diagram of a stage in the formation of transistor 104 in accordance with an embodiment of the present disclosure. As illustrated in FIG. 7I, first dielectric 112 and second dielectric 160 can be etched to the same level as gate dielectric 114 to create source cavity 156 and drain cavity 158. Third dielectric 120 can act as an etch stop and help prevent channel 116 and passivation layer 118 from being etched.

Figure 8:
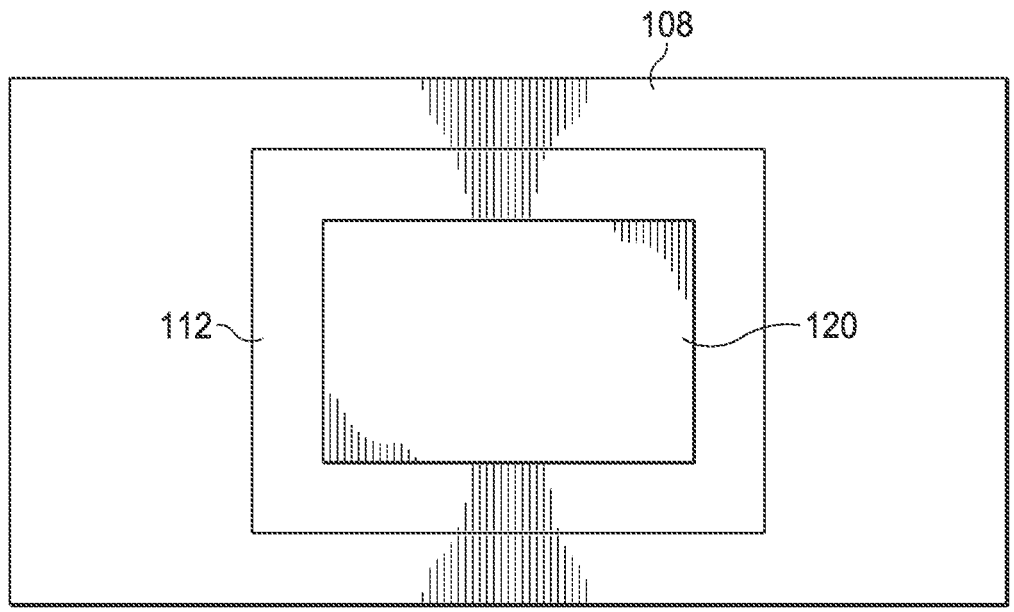
FIG. 8 is a simplified block diagram illustrating an embodiment of a portion of an electronic device, in accordance with one embodiment of the present disclosure.

Turning to FIG. 8, FIG. 8 illustrates a simplified block diagram of a stage in the formation of transistor 104 in accordance with an embodiment of the present disclosure. FIG. 8, is a top view of FIG. 7H illustrating oxide 108 first dielectric 112, and third dielectric 120. Gate 110, gate dielectric 114, channel 116, passivation layer 188, and third dielectric 120 are under third dielectric 120.

Figure 9:
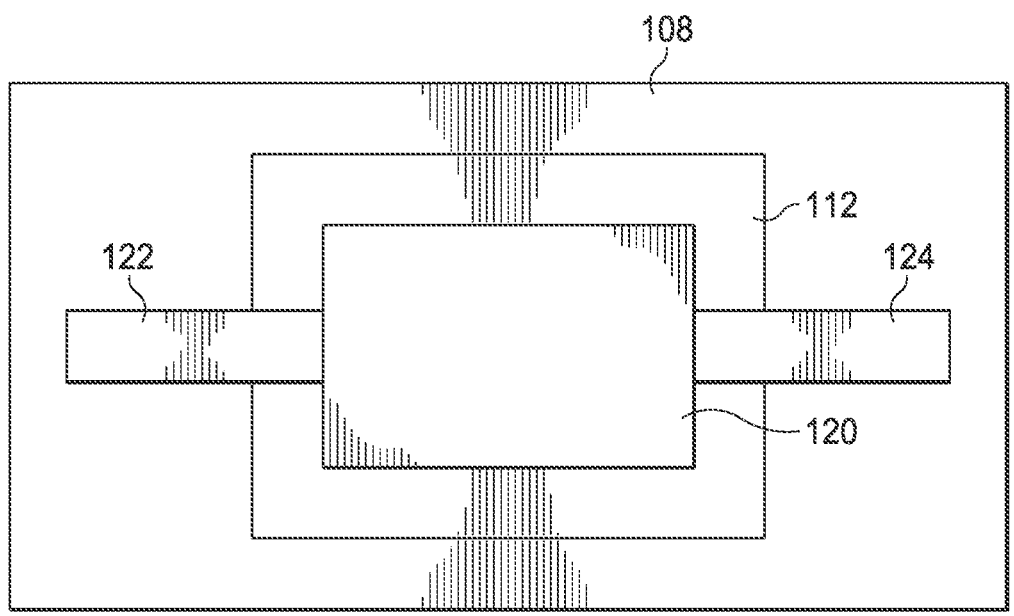
FIG. 9 is a simplified block diagram illustrating an embodiment of a portion of an electronic device, in accordance with one embodiment of the present disclosure.

Turning to FIG. 9, FIG. 9 illustrates a simplified block diagram of a stage in the formation of transistor 104 in accordance with an embodiment of the present disclosure. FIG. 9, is a top view of FIG. 7I after source 122 has been deposited into source cavity 156 and drain 124 has been deposited into drain cavity 158. For example, source 122 and drain 124 may be deposited using a spin-on deposition from slurry, sputtering, CVD, TVD, ALD, or any combination, or some other form of deposition that can source in source cavity 156 and drain 124 in drain cavity 158. Source 122 and drain 124 may be about 1 nanometer to about 40 nanometers in thickness.

Figure 10:
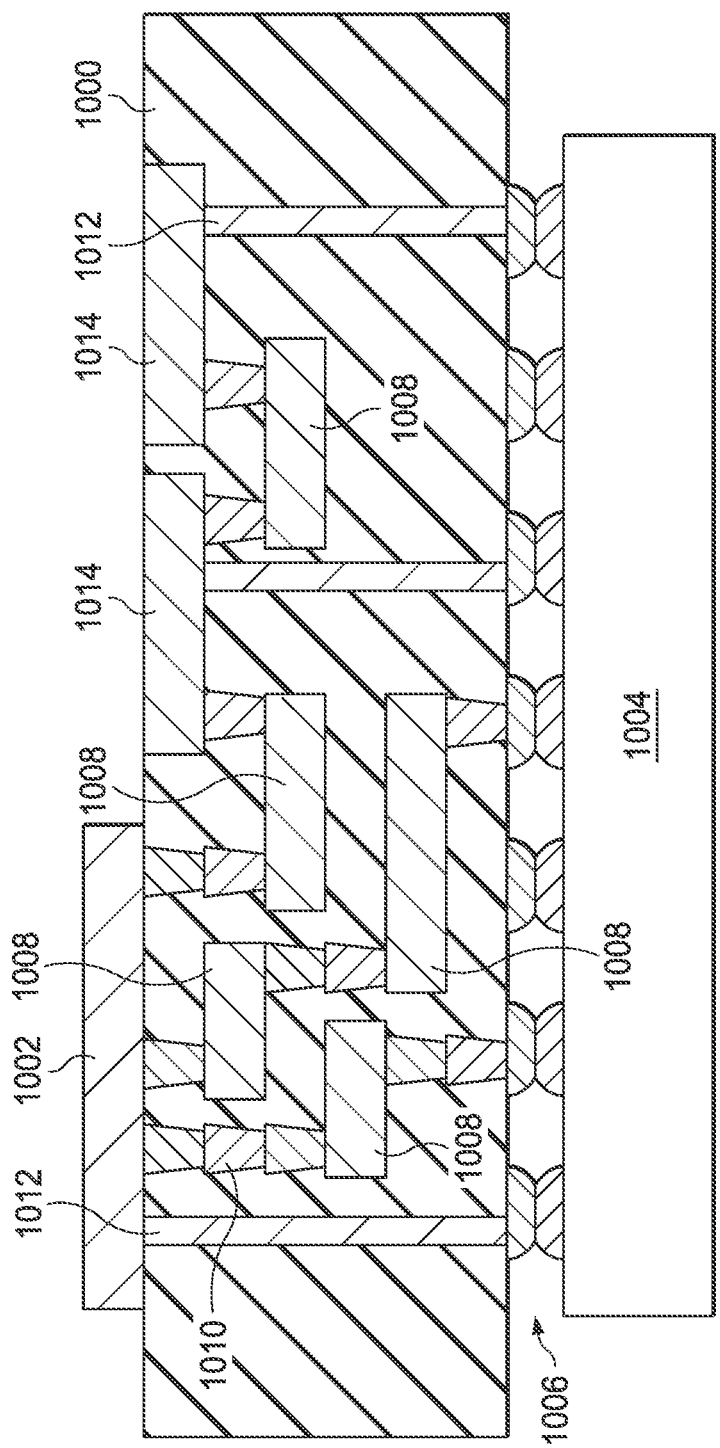
FIG. 10 is an interposer implementing one or more of the embodiments disclosed herein.

Turning to FIG. 10, FIG. 10 illustrates an interposer 1000 that can include or interact with one or more embodiments disclosed herein. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with various embodiments, apparatuses or processes disclosed herein may be used in the fabrication of interposer 1000.

Figure 11:
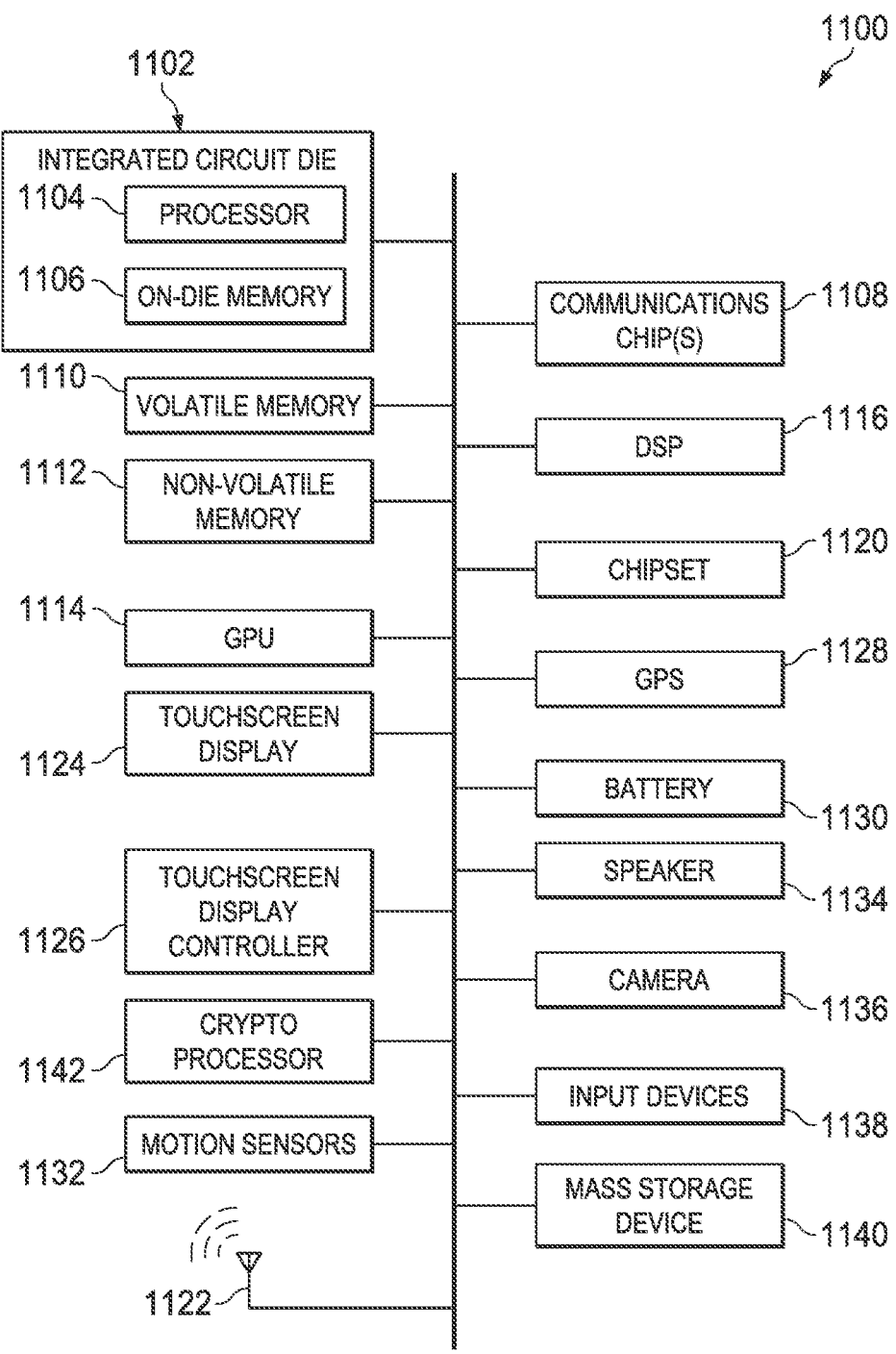
FIG. 11 is a computing device built in accordance with an embodiment disclosed herein.

Turning to FIG. 11, FIG. 11 illustrates a computing device 1100 in accordance with various embodiments. The computing device 1100 may include a number of components. In one embodiment, these components are attached to one or more motherboards. In an alternate embodiment, some or all of these components are fabricated onto a single system-on-a-chip (SoC) die. The components in the computing device 1100 include, but are not limited to, an integrated circuit die 1102 and at least one communications logic unit 1108. In some implementations, the communications logic unit 1108 is fabricated within the Integrated circuit die 1102 while in other implementations the communications logic unit 1108 is fabricated in a separate integrated circuit chip that may be bonded to a substrate or motherboard that is shared with or electronically coupled to the integrated circuit die 1102. The integrated circuit die 1102 may include a CPU 1104 as well as on-die memory 1106, often used as cache memory, that can be provided by technologies such as embedded DRAM (eDRAM) or spin-transfer torque memory (STTM or STT-MRAM).

Computing device 1100 may include other components that may or may not be physically and electrically coupled to the motherboard or fabricated within an SoC die. These other components include, but are not limited to, volatile memory 1110 (e.g. DRAM), non-volatile memory 1112 (e.g., ROM or flash memory), a graphics processing unit 1114 (GPU), a digital signal processor 1116, a crypto processor 1142 (a specialized processor that executes cryptographic algorithms within hardware), a chipset 1120, an antenna 1122, a display or a touchscreen display 1124, a touchscreen controller 1126, a battery 1128 or other power source, a power amplifier (not shown), a voltage regulator (not shown), a global positioning system (GPS) device 1128, a compass 1130, a motion coprocessor or sensors 1132 (that may include an accelerometer, a gyroscope, and a compass), a speaker 1134, a camera 1136, user input devices 1138 (such as a keyboard, mouse, stylus, and touchpad), and a mass storage device 1140 (such as hard disk drive, compact disk (CD), digital versatile disk (DVD), and so forth).

The communications logic unit 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communications logic units 1108. For instance, a first communications logic unit 1108 may be dedicated to shorter range wireless communications such as Wi-Fi and Bluetooth and a second communications logic unit 1108 may be dedicated to longer range wireless communications such as GPS, EDGE, GPRS, CDMA, WiMAX, LTE, Ev-DO, and others.

The processor 1104 of the computing device 1100 can communicate with one or more devices that are formed in accordance with various embodiments. The term "processor" may refer to any device or portion of a device that processes electronic data from registers and/or memory to transform that electronic data into other electronic data that may be stored in registers and/or memory.

The communications logic unit 1108 may also include one or more devices, such as transistors or metal interconnects, that are in communication with various ones of the embodiments disclosed herein. In further embodiments, another component housed within the computing device 1100 may contain one or more devices, such as transistors or metal interconnects, that are formed in accordance with implementations of the embodiments disclosed herein.

In various embodiments, the computing device 1100 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

OTHER NOTES AND EXAMPLES

Example 1 is an apparatus including a gate, where the gate includes a first gate side and a second gate side opposite to the first gate side, a gate dielectric on the gate, where the gate dielectric includes a first gate dielectric side and a second gate dielectric side opposite to the first gate dielectric side, a first dielectric, where the first dielectric abuts the first gate side, the first gate dielectric side, the second gate side, and the second gate dielectric side, a channel, where the gate dielectric is between the channel and the gate, a source coupled with the channel, and a drain coupled with the channel, where the first dielectric abuts the source and the drain.

In Example 2, the subject matter of Example 1 can optionally include a second dielectric between a portion of the first dielectric and the source.

In Example 3, the subject matter of any one of Examples 1 and 2 can optionally include where the first dielectric and the gate dielectric insulate the gate from the channel, the source, and the drain.

In Example 4, the subject matter of any one of Examples 1-3 can optionally include a passivation layer between the source and the drain.

In Example 5, the subject matter of any one of Examples 1-4 can optionally include a third dielectric on the passivation layer.

In Example 6, the subject matter of any one of Examples 1-5 can optionally include where the apparatus is on an interlayer gate dielectric.

In Example 7, the subject matter of any one of Examples 1-6 can optionally include where the apparatus is coupled to a capacitive element.

In Example 8, the subject matter of any one of Examples 1-7 can optionally include where the capacitive element is embedded dynamic random access memory.

In Example 9, a method including depositing a gate on an oxide, depositing a gate dielectric on the gate, depositing a first dielectric along two sides of the gate and the gate dielectric, and depositing a channel on the gate dielectric and the first dielectric.

In Example 10, the subject matter of Example 9 can optionally include depositing a second dielectric on a portion of the first dielectric and depositing a source and a drain on a second dielectric and the first dielectric, where the channel couples the source and the drain.

In Example 11, the subject matter of any one of Examples 9 and 10 can optionally include depositing a passivation layer between the source and the drain.

In Example 12, the subject matter of any one of Examples 9-11 can optionally include where the drain is coupled to a capacitive element.

In Example 13, the subject matter of any one of Examples 9-12 can optionally include where the drain is coupled to embedded dynamic random access memory.

In Example 14, the subject matter of any one of Examples 9-13 can optionally include where the oxide layer is over a logic element.

Example 15 is a computing device including a processor mounted on a substrate, a communications logic unit within the processor, a memory within the processor, a graphics processing unit within the computing device, an antenna within the computing device, a display on the computing device, a battery within the computing device, a power amplifier within the processor, and a voltage regulator within the processor. The memory can be coupled to a backend transistor and the backend transistor can include a gate, where the gate includes a first gate side and a second gate side opposite to the first gate side, a gate dielectric on the gate, where the gate dielectric includes a first gate dielectric side and a second gate dielectric side opposite to the first gate dielectric side, a first dielectric, where the first dielectric abuts the first gate side, the first gate dielectric side, the second gate side, and the second gate dielectric side, a channel, where the gate dielectric is between the channel and the gate, a source coupled with the channel, and a drain coupled with the channel, where the first dielectric abuts the source and the drain.

In Example 16 the subject matter of Example 15 can optionally include where the backend transistor further includes a second dielectric between a portion of the first dielectric and the source.

In Example 17 the subject matter of any one of Examples 15 and 16 can optionally include where the first dielectric and the gate dielectric insulate the gate from the channel, the source, and the drain.

In Example 18, the subject matter of any one of the Examples 15-17 can optionally include a passivation layer between the source and the drain.

In Example 19, the subject matter of any one of the Examples 15-18 can optionally include where the memory element is embedded dynamic random access memory.

In Example 20, the subject matter of any one of the Examples 15-19 can optionally include where the backend transistor is on an interlayer gate dielectric Example 21 is an integrated circuit (IC) assembly including a substrate, a device layer including one or more first transistors on the substrate, an interconnect stack on the device layer to route electrical signals to the first transistors, and a second transistor, embedded in the interconnect stack. The second transistor can include a gate, where the gate includes a first gate side and a second gate side opposite to the first gate side, a gate dielectric on the gate, where the gate dielectric includes a first gate dielectric side and a second gate dielectric side opposite to the first gate dielectric side, a first dielectric, where the first dielectric abuts the first gate side, the first gate dielectric side, the second gate side, and the second gate dielectric side, a channel, where the gate dielectric is between the channel and the gate, a source coupled with the channel, and a drain coupled with the channel, where the first dielectric abuts the source and the drain.

In Example 22, the subject matter of Example 21 can optionally include a second dielectric between a portion of the first dielectric and the source.

In Example 23, the subject matter of any one of the Examples 21 and 22-23 can optionally include where the first dielectric and the gate dielectric insulate the gate from the channel, the source, and the drain.

In Example 24, the subject matter of any one of the Examples 21-23 can optionally include a passivation layer between the source and the drain.

In Example 25, the subject matter of any one of the Examples 22-24 can optionally include where the interconnect stack is coupled to a capacitive element.

The invention claimed is:
1. An apparatus, comprising:
   a gate, wherein the gate includes a first gate side and a second gate side opposite to the first gate side;
   a gate dielectric on the gate, wherein the gate dielectric includes a first gate dielectric side and a second gate dielectric side opposite to the first gate dielectric side;
   a first dielectric, wherein the first dielectric abuts the first gate side, the first gate dielectric side, the second gate side, and the second gate dielectric side;
   a channel, wherein the gate dielectric is between the channel and the gate;
   a source coupled with the channel;
   a drain coupled with the channel, wherein the first dielectric abuts the source and the drain; and
   a second dielectric between a portion of the first dielectric and the source.
2. The apparatus of claim 1, wherein the first dielectric and the gate dielectric insulate the gate from the channel, the source, and the drain.
3. The apparatus of claim 1, further comprising:
   a passivation layer between the source and the drain.
4. The apparatus of claim 3, further comprising:
   a third dielectric over the passivation layer.
5. The apparatus of claim 1, wherein the apparatus is over an interlayer dielectric.
6. The apparatus of claim 1, wherein the apparatus is coupled to a capacitive element.
7. The apparatus of claim 6, wherein the capacitive element is a part of an embedded dynamic random-access memory.
8. A method, comprising:
   depositing a gate on an oxide;
   depositing a gate dielectric over the gate;
   depositing a first dielectric along two sides of the gate and the gate dielectric;
   depositing a channel over the gate dielectric and the first dielectric;
   depositing a second dielectric over a portion of the first dielectric; and
   depositing a source and a drain over the second dielectric and the first dielectric, wherein the channel is configured to couple the source and the drain.
9. The method of claim 8, further comprising:
   depositing a passivation layer between the source and the drain.

10. The method of claim 8, wherein the drain is coupled to a capacitive element.

11. The method of claim 8, wherein the drain is coupled to an embedded dynamic random-access memory.

12. The method of claim 8, wherein the oxide is over a logic element.

13. A computing device, comprising:
   a transistor; and
   a memory;
   wherein the memory is coupled to the transistor and the transistor includes:
   a gate, wherein the gate includes a first gate side and a second gate side opposite to the first gate side;
   a gate dielectric over the gate, wherein the gate dielectric includes a first gate dielectric side and a second gate dielectric side opposite to the first gate dielectric side;
   a first dielectric, wherein the first dielectric abuts the first gate side, the first gate dielectric side, the second gate side, and the second gate dielectric side;
   a channel, wherein the gate dielectric is between the channel and the gate;
   a source coupled with the channel; and
   a drain coupled with the channel, wherein the first dielectric abuts the source and the drain; and
   a second dielectric between a portion of the first dielectric and the source.

14. The computing device of claim 13, wherein the first dielectric and the gate dielectric insulate the gate from the channel, the source, and the drain.

15. The computing device of claim 13, wherein the transistor further includes:
   a passivation layer between the source and the drain.

16. The computing device of claim 13, wherein the memory is an embedded dynamic random-access memory.

17. The computing device of claim 13, wherein the transistor is over an interlayer dielectric.

18. The computing device of claim 13, further comprising a communications logic.

19. The computing device of claim 13, further comprising an antenna.

20. The computing device of claim 13, further comprising a power amplifier.

* * * * *